US009696205B2

(12) United States Patent
Iguchi et al.

(10) Patent No.: US 9,696,205 B2
(45) Date of Patent: Jul. 4, 2017

(54) ARRAY TYPE LIGHT-RECEIVING DEVICE AND HYPERSPECTRAL SPECTROMETER INCLUDING ARRAY TYPE LIGHT-RECEIVING DEVICE

(71) Applicant: SUMITOMO ELECTRIC INDUSTRIES, LTD., Osaka (JP)

(72) Inventors: Yasuhiro Iguchi, Yokohama (JP); Hiroshi Inada, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 262 days.

(21) Appl. No.: 14/727,318

(22) Filed: Jun. 1, 2015

(65) Prior Publication Data
US 2015/0355026 A1 Dec. 10, 2015

(30) Foreign Application Priority Data

Jun. 4, 2014 (JP) .................................. 2014-115879

(51) Int. Cl.
*G01J 3/28* (2006.01)
*H01L 27/146* (2006.01)

(52) U.S. Cl.
CPC ........... *G01J 3/2803* (2013.01); *G01J 3/2823* (2013.01); *H01L 27/14605* (2013.01); *H01L 27/14607* (2013.01); *H01L 27/14634* (2013.01)

(58) Field of Classification Search
CPC ....... G01J 3/2803; G01J 3/2823; H01L 31/10; H01L 27/14605; G06K 2009/00644; G06T 2207/10036
See application file for complete search history.

(56) References Cited

U.S. PATENT DOCUMENTS

| 7,154,546 B1* | 12/2006 | Cho ...................... H04N 9/045 348/272 |
| 2010/0013979 A1* | 1/2010 | Golub .................. G01J 3/2803 348/340 |
| 2014/0233028 A1* | 8/2014 | Englund ............... G01J 3/2823 356/303 |

FOREIGN PATENT DOCUMENTS

| JP | 2013-093385 | 5/2013 |
| JP | 2013-201219 | 10/2013 |

OTHER PUBLICATIONS

H. Inada et al., "MOVPE grown InGaAs/GaAsSb Type II Quantum Well Photodiode for SWIR Focal Plane Array", Proceeding of *SPIE*, vol. 8012, Infrared Technology and Applications XXXVII, 801220-1 through 801220-6 (2011).

* cited by examiner

*Primary Examiner* — Kara E Geisel
*Assistant Examiner* — Maurice Smith
(74) *Attorney, Agent, or Firm* — Smith, Gambrell & Russell, LLP.

(57) ABSTRACT

An array type light-receiving device includes a plurality of pixels two-dimensionally arranged in a first direction and a second direction perpendicular to the first direction, each of the pixels including a light-receiving layer having a responsivity to a wavelength of light. The pixels arranged in the second direction constitute a plurality of pixel lines extending in the second direction, the plurality of pixel lines being arranged in the first direction to form an array. The pixels in each of the pixel lines have different pixel areas from each other. In addition, the pixel area of each of the pixels included in at least one of the pixel lines is determined in accordance with the responsivity to a wavelength of light received by each of the pixels.

9 Claims, 9 Drawing Sheets

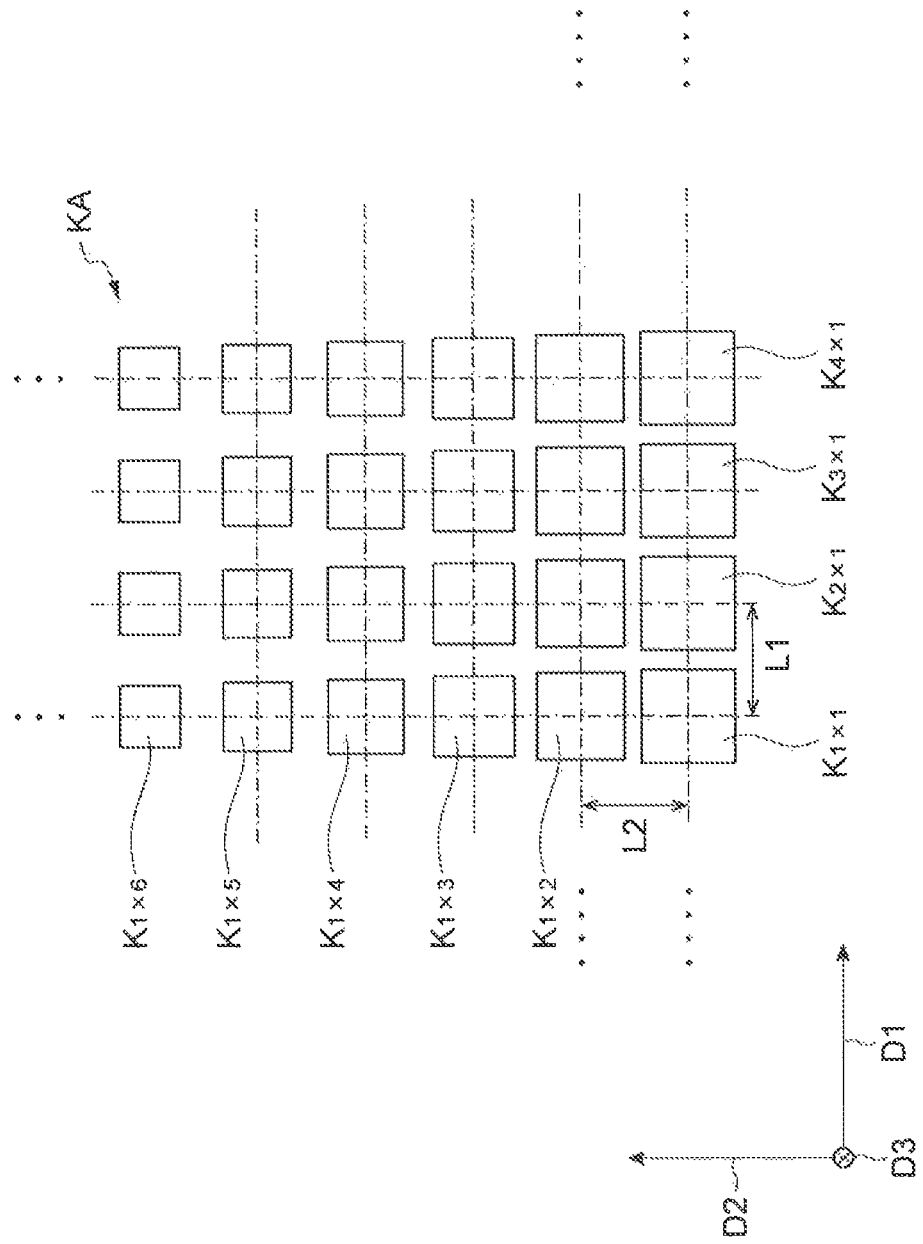

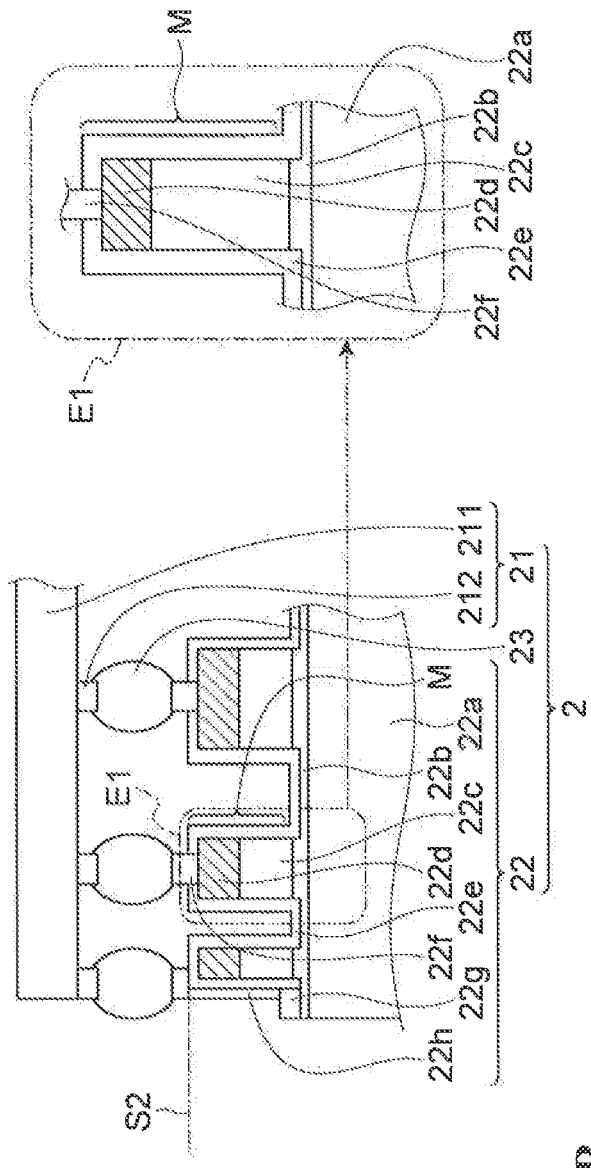
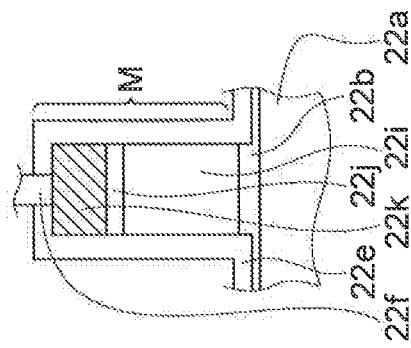
FIG. 6A
FIG. 6B

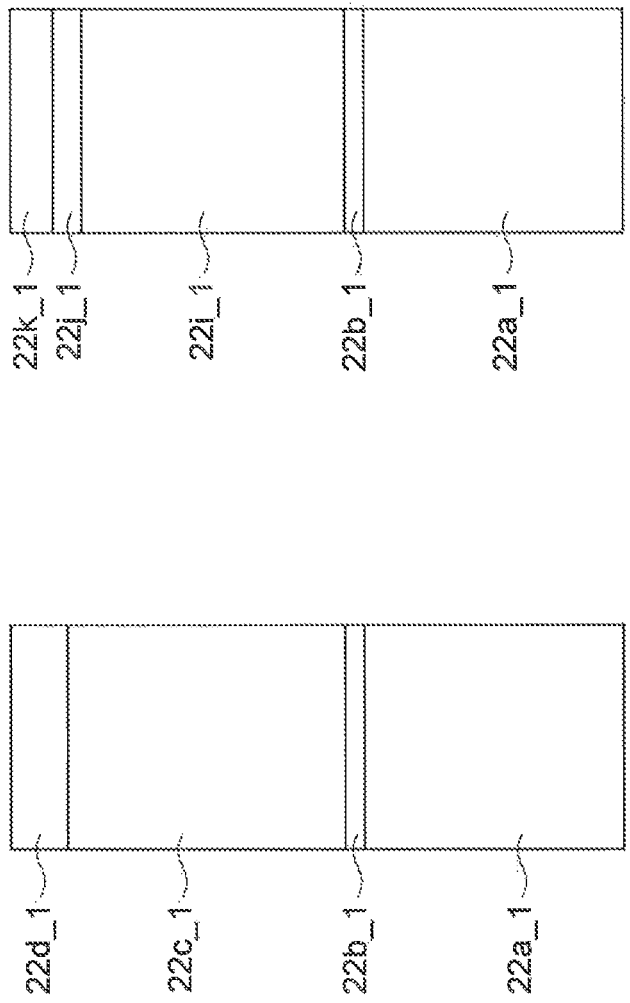

ARRAY TYPE LIGHT-RECEIVING DEVICE AND HYPERSPECTRAL SPECTROMETER INCLUDING ARRAY TYPE LIGHT-RECEIVING DEVICE

BACKGROUND OF THE INVENTION

1. Field of the Invention

The present invention relates to an array type light-receiving device and a hyperspectral spectrometer including the array type light-receiving device.

2. Description of the Related Art

Patent Literature 1 (Japanese Unexamined Patent Application Publication No. 2013-93385) discloses light-receiving devices and related techniques. The light-receiving device described in Patent Literature 1 has a plurality of pixels disposed on a semiconductor substrate. Each of the pixels of the light-receiving device includes a light-receiving layer for receiving light, a p-n junction disposed in the light-receiving layer, and a mesa structure defined by grooves. The plurality of pixels is spaced apart from each other by the grooves disposed around the mesa structures. An impurity wall layer is disposed on a wall surface of the mesa structure so as to prevent the p-n junction from being exposed at the wall surface of the mesa structure. Patent Literature 2 (Japanese Unexamined Patent Application Publication No. 2013-201219) discloses light-receiving devices and related techniques. The light-receiving device described in Patent Literature 2 has a plurality of pixels disposed on a semiconductor substrate. Each of the pixels includes a mesa structure defined by a groove. The mesa structure includes a light-receiving layer disposed in a stacked semiconductor layer, and a p-n junction located at an interface between the light-receiving layer and a p-type semiconductor layer disposed on the light-receiving layer. The plurality of pixels is separated from each other by the grooves disposed between the mesa structures. The groove is extended from a surface of the stacked semiconductor layer toward the semiconductor substrate through the p-n junction. The sidewall of the mesa structure is tapered such that the sectional area of the light-receiving layer is decreased toward the p-n junction. The semiconductor layer disposed on the light-receiving layer has an overhang portion that surrounds the p-n junction. The overhang portion of the semiconductor layer is overhung toward the grooves defining the mesa structure. Non-Patent Literature 1 ("MOVPE grown InGaAs/GaAsSb Type II Quantum Well Photodiode for SWIR Focal Plane Array", H. Inada, H. Mori, Y. Nagai, Y. Iguchi, T. Saitoh, K. Fujii, T. Ishizuka, K. Akita, Proceeding of SPIE, vol. 8012 801220 (2011)) discloses a technique related to photodiodes having a type-II InGaAs/GaAsSb quantum well structure. Non-Patent Literature 1 describes a pixel size with a pixel pitch of 30 µm and a diameter of 15 µm.

SUMMARY OF THE INVENTION

A hyperspectral camera includes a two-dimensional array sensor that includes a plurality of pixels arranged in a lateral direction and a longitudinal direction. From the pixels arranged in the lateral direction, spatial information (image information) is obtained. In addition, from the pixels arranged in the longitudinal direction, wavelength information is obtained. By using the hyperspectral camera, the optical spectrum for each of the pixels arranged in the lateral direction for obtaining the spatial information (image information) is simultaneously obtained. For example, in the two-dimensional array sensor having 320×256 pixels, the 320 pixels arranged in the lateral direction provide spatial information. The 256 pixels arranged in the longitudinal direction provide wavelength information. In order to obtain the wavelength information, light that has been reflected from or passed through an object to be measured is spectrally diffracted by a spectroscope such as a prism. The light components diffracted spectrally are then incident on the 256 pixels of the array sensor arranged in the longitudinal direction so as to be converted into electrical signals (photocurrent). Where necessary, the object to be measured is irradiated with light by using a halogen lamp as a light source, especially in infrared hyperspectral systems. The electrical signals output from the array sensor are accumulated in capacitors in a read-out IC for a predetermined time (for example, 1 msec) and are thereafter read out to the outside. Usually, the array sensor has a responsivity having a wavelength dependence related to the semiconductor material constituting a light-receiving layer included in the pixels. When the light-receiving layer in the pixels is made of InGaAs, for example, the array sensor has a peak of responsivity at a wavelength of 1620 nm. Therefore, the photocurrent output from the pixel received a light component having a wavelength of 1620 nm is larger than the photocurrents output from the pixels received light components having wavelengths other than the wavelength of 1620 nm even when the light components have the same optical intensity. Capacitors in a read-out IC can store a limited amount of charges. The conditions (incident light intensity and accumulation time) to fully charge capacitors in a read-out IC are different in each of the capacitors according to the pixels connected to the capacitors. Specifically, when the light-receiving layer in the pixels is made of InGaAs, the capacitor connected to the pixel that receives light with a wavelength near 1620 nm is fully charged with a smaller optical intensity of the incident light and/or in a smaller accumulation time as compared with the capacitor connected to a pixel that receives light having a wavelength (a wavelength of below 1000 nm or above 1620 nm). When the conditions of the incident light intensity and the accumulation time of the capacitor are adjusted so that the capacitor connected to a pixel receiving a light having a wavelength at which the pixel has a smaller responsivity has an optimum amount of charges, the capacitor connected to a pixel receiving a light having a wavelength near 1620 nm at which the pixel has a larger responsivity is oversaturated. In the reverse case, the capacitor connected to a pixel receiving a light having a wavelength at which the pixel has a smaller responsivity is charged insufficiently and consequently the S/N ratio (the signal to noise ratio) of the pixel is decreased as compared with the capacitor connected to a pixel receiving a light having a wavelength near 1620 nm at which the pixel has a larger responsivity. In order to improve the S/N ratio of the pixel in the array sensor, it is desirable that conditions allow charges to be accumulated until immediately before the capacitors are saturated. However, the wavelength dependency of the responsivity of the pixel in the array sensor causes significant variations in the amounts of charges accumulated in the capacitors depending on wavelengths. Consequently, the S/N ratios are variable depending on wavelengths.

An array type light-receiving device according to an aspect of the present invention includes a plurality of pixels two-dimensionally arranged in a first direction and a second direction perpendicular to the first direction, each of the pixels including a light-receiving layer having a responsivity to a wavelength of light. The pixels arranged in the second direction constitute a plurality of pixel lines extending in the second direction, the plurality of pixel lines being arranged in the first direction to form an array. The pixels in each of the pixel lines have different pixel areas from each other. In addition, the pixel area of each of the pixels included in at least one of the pixel lines is determined in accordance with the responsivity to a wavelength of light received by each of the pixels.

BRIEF DESCRIPTION OF THE DRAWINGS

FIG. 5 is a view illustrating an arrangement of pixels and pixel areas for InGaAs light-receiving layers.

FIGS. 6A and 6B are views illustrating inside configurations of mesa-type photodetectors having mesa structures corresponding to pixels.

FIGS. 7A and 7B are views illustrating processes for manufacturing mesa-type photodetectors having mesa structures corresponding to pixels.

DESCRIPTION OF THE PREFERRED EMBODIMENTS

Description of Embodiments

Figure 1:
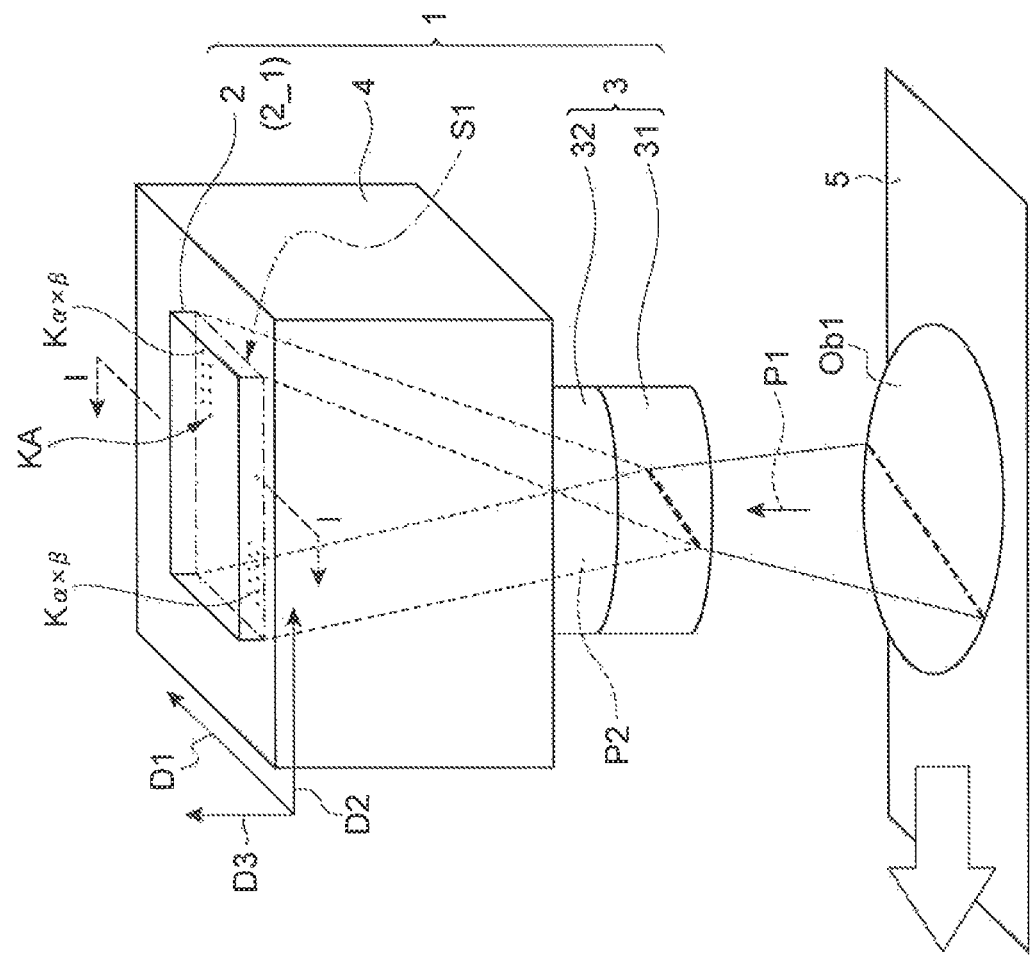
FIG. 1 is a view illustrating an outside configuration of a hyperspectral spectrometer according to an embodiment.

First, embodiments of the present invention will be listed and described. An array type light-receiving device according to an aspect of the present invention includes a plurality of pixels two-dimensionally arranged in a first direction and a second direction perpendicular to the first direction, each of the pixels including a light-receiving layer having a responsivity to a wavelength of light. The pixels arranged in the second direction constitute a plurality of pixel lines extending in the second direction, the plurality of pixel lines being arranged in the first direction to form an array. The pixels in each of the pixel lines have different pixel areas from each other. In addition, the pixel area of each of the pixels included in at least one of the pixel lines is determined in accordance with the responsivity to a wavelength of light received by each of the pixels.

In the array type light-receiving device according to one aspect of the invention, preferably, the pixels included in each of the pixel lines include a first pixel configured to receive light with a wavelength at which the pixel has a lowest responsivity in the responsivities to the wavelengths of incident light, and a second pixel other than the first pixel. The first pixel has the largest pixel area of the pixels included in the pixel line. The second pixel has a pixel area determined by the relational expression:

$$A_\beta = E/R_\beta,$$

where $A_\beta$ represents the pixel area of the second pixel, E represents product of the responsivity of the first pixel at the wavelength of light received by the first pixel multiplied by the pixel area of the first pixel, and $R_\beta$ represents the responsivity of the second pixel at the wavelength of light received by the second pixel.

In the array type light-receiving device, the pixel area of each of the pixels included in at least one of the pixel lines is determined in accordance with the responsivity to the wavelength of light received by each of the pixels. Specifically, the pixel areas of the pixels are determined so that the product of the responsivity to the wavelength of light received by each of the pixels multiplied by the pixel area is constant. As a result, the amounts of light received by the pixels are controlled by changing the pixel areas of the pixels in accordance with the responsivities to wavelengths of light received by the pixels. Accordingly, photocurrents (charges) output from the pixels are uniform in receiving light components with the same intensity even when light components received by the pixels have different wavelengths. The difference in photocurrents (charges) output from the pixels due to the spectral sensitivity characteristics depending on the wavelengths of light is reduced. Accordingly, the S/N ratios of the pixels in the array type light-receiving device are improved.

In the array type light-receiving device according to one aspect of the invention, preferably, the plurality of pixels included in each of the pixel lines are arranged so as to receive corresponding light components having different wavelengths, the light components being separated along the second direction depending on the wavelengths. In the array type light-receiving device, the pixels included in each of the pixel lines receive corresponding light components having predetermined wavelengths. The pixel areas of the pixels are determined in accordance with the responsivities to the predetermined wavelengths of light components.

In the array type light-receiving device according to one aspect of the invention, the pixels arranged in the first direction may constitute a plurality of pixel rows extending in the first direction. The pixel areas of the pixels in each of the pixel rows may be approximately equal to each other.

Preferably, the array type light-receiving device according to one aspect of the invention further includes a plurality of mesas corresponding to the pixels, each of the mesas including the light-receiving layer, a passivation film disposed on a top surface and a side surface of the mesa, the passivation film including an opening on the top surface of the mesa, and an electrode disposed in the opening in contact with the top surface of the mesa.

Preferably, the array type light-receiving device according to one aspect of the invention further includes a plurality of impurity diffusion regions corresponding to the pixels, each of the impurity diffusion regions extending from a top surface of the pixel toward the light-receiving layer, a mask disposed on the top surface of the pixel, the mask having an opening on the impurity diffusion region, and an electrode disposed in the opening in contact with a top surface of the impurity diffusion region.

In the array type light-receiving device according to one aspect of the invention, the light-receiving layer may include an InGaAs layer. In addition, the light-receiving layer may have a multi quantum well structure including InGaAs layers and GaAsSb layers stacked alternately.

A hyperspectral spectrometer according to another aspect of the present invention includes an array type light-receiving device and a spectroscope configured to disperse an incident light spectrally into a plurality of light components having different wavelengths, the spectroscope outputting a dispersed light to the array type light-receiving device. The array type light-receiving device includes a plurality of pixels two-dimensionally arranged in a first direction and a second direction perpendicular to the first direction, each of the pixels including a light-receiving layer having a responsivity to a wavelength of light. The pixels arranged in the second direction constitute a plurality of pixel lines extending in the second direction, the plurality of pixel lines being arranged in the first direction to form an array. The light components of the dispersed light are separated along the second direction depending on the wavelengths. Each of the pixels in the pixel line is configured to receive at least one of the light components. In addition, the pixels in each of the pixel line have different pixel areas, each of which is determined in accordance with the responsivity to the wavelength of the light component received by each of the pixels.

DETAILED DESCRIPTION OF EMBODIMENTS

Specific examples of the array type light-receiving devices according to embodiments of the present invention will be described below with reference to the drawings. However, the scope of the invention is defined by the appended claims and is not limited to such examples. It is intended that the scope of the invention covers all modifications that are within the spirit and scope equivalent to the claims.

FIG. 1 is a view illustrating a principal configuration of a hyperspectral spectrometer 1. The hyperspectral spectrometer 1 includes a photodetector 2, a spectroscopic device 3 and a cabinet 4. The spectroscopic device 3 includes a lens 31 and a spectroscope 32. The lens 31 is positioned to face a belt conveyer 5. The spectroscope 32 is disposed on the lens 31. The cabinet 4 is disposed on the spectroscope 32. The photodetector 2 is disposed in the cabinet 4 and is positioned to face the spectroscopic device 3. The spectroscopic device 3 receives light P1 reflected from or passed through an object Ob1 placed on the belt conveyer 5. The light P1 includes a plurality of light components having different wavelengths. When the light P1 is incident on the spectroscopic device 3, the spectroscopic device 3 spectrally disperses the light P1 along a direction D2 (the second direction) according to wavelengths, and outputs the dispersed light as light P2 to the photodetector 2. The light components of the dispersed light are separated along the direction D2 (the second direction) depending on the wavelengths. The light P1 and the light P2 extend in a direction D1 (the first direction) in accordance with the width of the object Ob1. The direction D1 is perpendicular to the direction D2. A direction D3 is perpendicular to the direction D1 and the direction D2.

Figure 2:
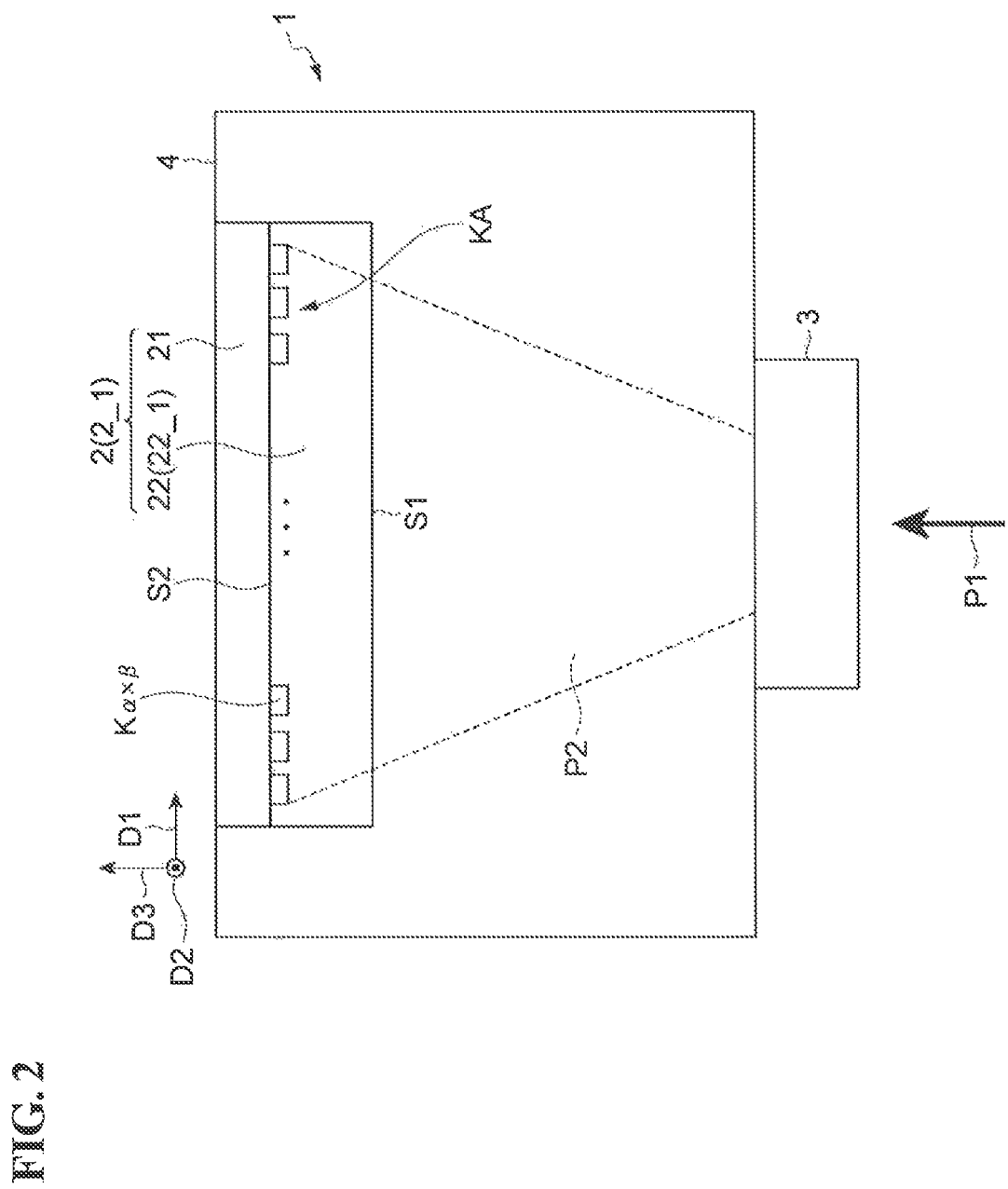
FIG. 2 is a view illustrating an inside configuration of a hyperspectral spectrometer according to an embodiment.

FIG. 2 is a schematic view illustrating a configuration of the hyperspectral spectrometer 1 as seen from a plane along line I-I in FIG. 1. The photodetector 2 includes a read-out circuit board 21 and an array type light-receiving device 22. The array type light-receiving device 22 has a surface S1 and a surface S2 opposite to the surface S1. The surface S1 and the surface S2 of the array type light-receiving device 22 extend along the direction D1 and the direction D2. The surface S1 is positioned to face the spectroscopic device 3. In the embodiment, the surface S1 of the array type light-receiving device 22 serves as a light incident surface on which light is incident. The read-out circuit board 21 is electrically connected to electrodes of the array type light-receiving device 22 disposed on the surface S2. The array type light-receiving device 22 includes a plurality of pixels $K_{\alpha \times \beta}$. On the surface S2 of the array type light-receiving device 22, the plurality of pixels $K_{\alpha \times \beta}$ is two-dimensionally arranged to form a pixel array. The light P1 coming from the object Ob1 is dispersed by the spectroscopic device 3 in the direction D2 and the dispersed light P2 is incident on the plurality of pixels $K_{\alpha \times \beta}$ through the surface S1 of the array type light-receiving device 22.

Figure 3:
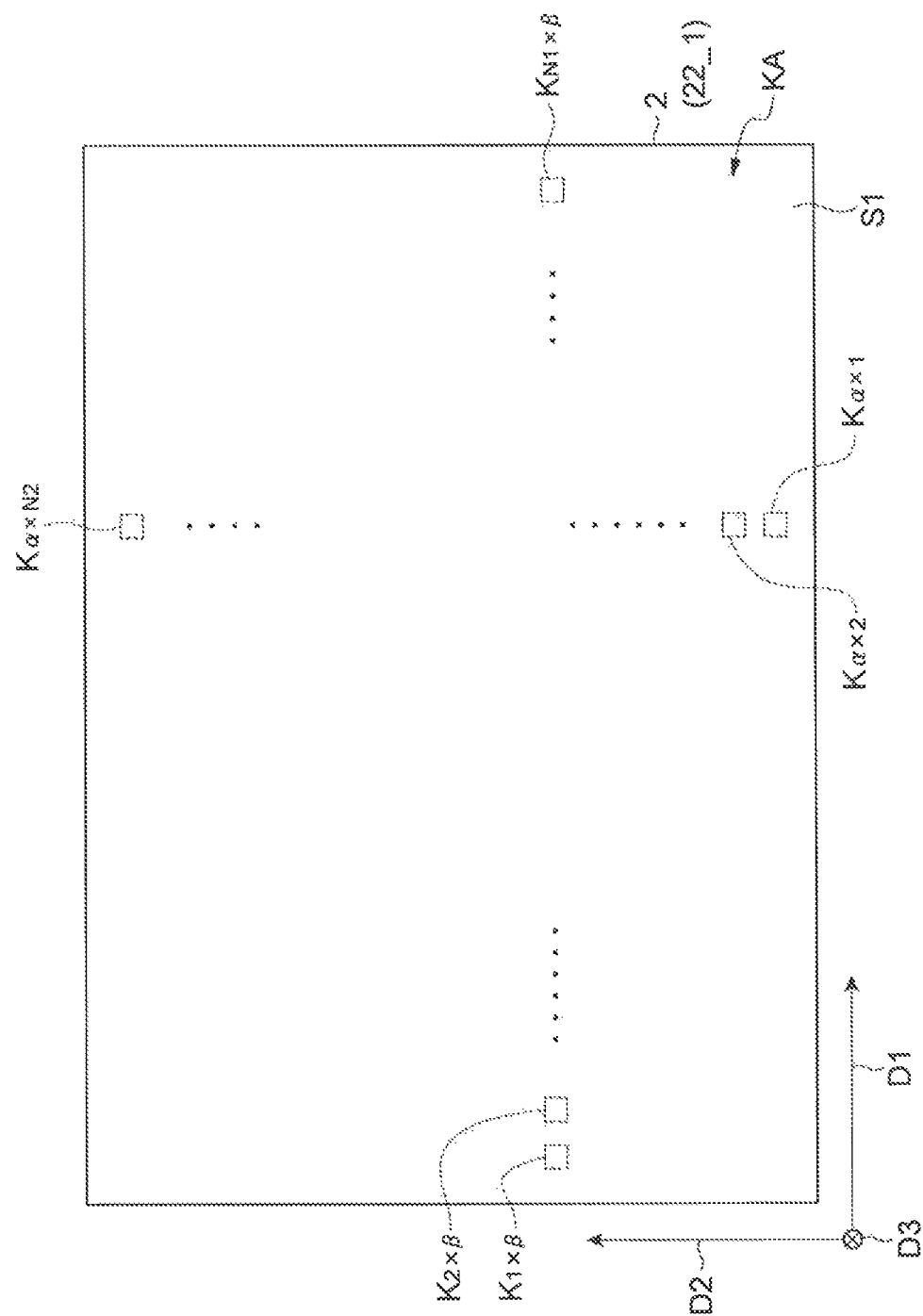
FIG. 3 is a view illustrating a pixel array of an array type light-receiving device according to an embodiment.
Figure 4:
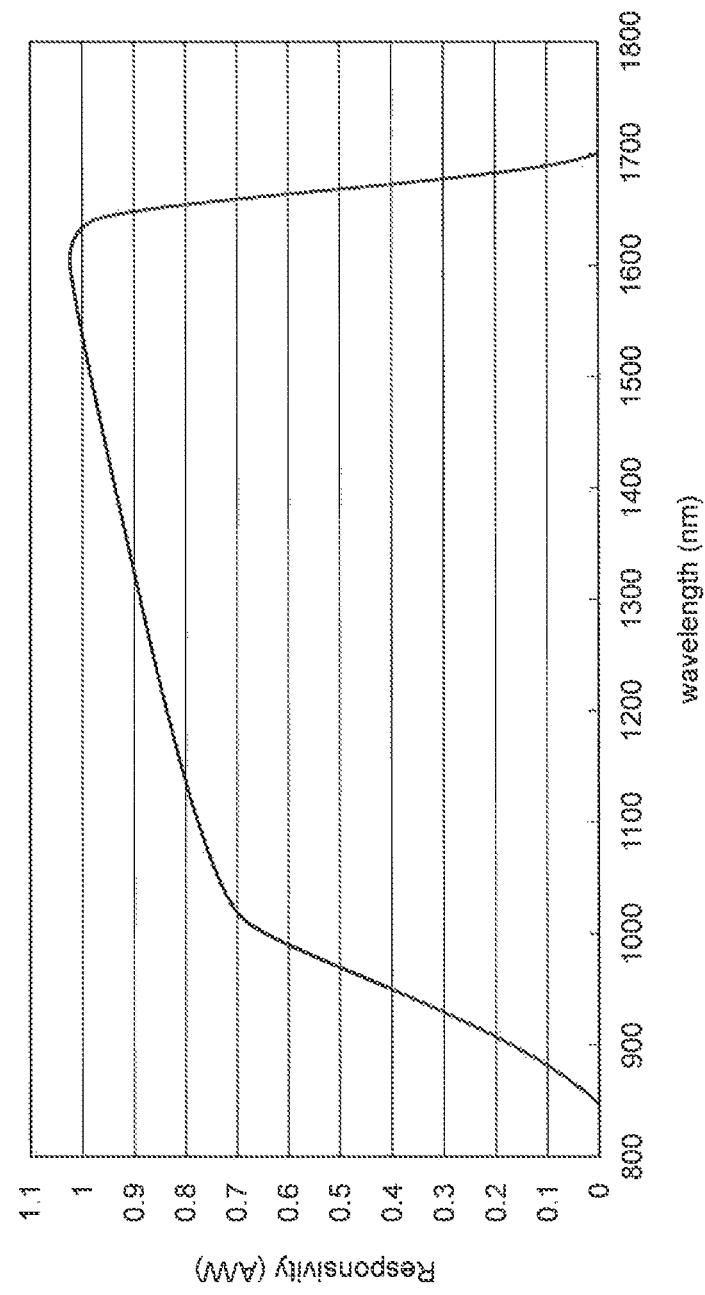
FIG. 4 is a diagram illustrating spectral sensitivity characteristics of pixels having InGaAs light-receiving layers.

The arrangement of N1×N2 pixels $K_{\alpha \times \beta}$ that constitute a pixel array KA of the array type light-receiving device 22 will be described with reference to FIG. 3. The N1×N2 pixels $K_{\alpha \times \beta}$ are composed of the same material. Accordingly, the plurality of pixels $K_{\alpha \times \beta}$ constituting the pixel array KA has identical spectral sensitivity characteristics. FIG. 4 illustrates an example of the spectral sensitivity characteristics of the pixels included in the array type light-receiving device 22. The spectral sensitivity characteristics indicate the responsivity (unit: A/W) according to the wavelength of incident light, namely, the wavelength dependency of responsivity. As shown in FIG. 4, each of the pixels $K_{\alpha \times \beta}$ has spectral sensitivity characteristics depending on the wavelengths of the incident light. The responsivity of each of the pixels $K_{\alpha \times \beta}$ is varied according to the wavelengths of the incident light.

N1 and N2 are both integers of 2 or greater. For example, N1 is 320 and N2 is 256. The N1×N2 pixels $K_{\alpha \times \beta}$ are two-dimensionally arranged along the direction D1 and direction D2 on the surface S2 of the array type light-receiving device 22. The positions of the pixels $K_{\alpha \times \beta}$ in the direction D1 correspond to the positions on a line of the object Ob1 at which light P1 is reflected from or passed through the object Ob1. The positions of the pixels $K_{\alpha \times \beta}$ in the direction D2 correspond to the wavelengths of the light P2 dispersed by the spectroscopic device 3.

N1 indicates the number of pixels $K_{\alpha \times \beta}$ in the direction D1. N2 indicates the number of pixels $K_{\alpha \times \beta}$ in the direction D2. The character α indicates the position of the pixel in the array of the pixels $K_{\alpha \times \beta}$ in the direction D1, specifically, is any of the integers of 1 to N1. The character β indicates the position of the pixel in the array of the pixels $K_{\alpha \times \beta}$ in the direction D2, specifically, is any of the integers of 1 to N2. The N1 pixels $K_{\alpha \times \beta}$ arranged in the direction D1 have constant pitches L1. The N2 pixels $K_{\alpha \times \beta}$ arranged in the direction D2 have constant pitches L2.

The number of the plurality of pixels $K_{\alpha \times \beta}$ arranged in the direction D1 (the line of pixels having a constant β) is N1. Specifically, the pixels $K_{\alpha \times \beta}$ include a pixel $K_{1 \times \beta}$, a pixel $K_{2 \times \beta}$, . . . and a pixel $K_{N1 \times \beta}$ (β is constant) arranged sequentially in the direction D1. The pixels $K_{\alpha \times \beta}$ (β is constant) arranged in the direction D1 constitute a plurality of pixel rows extending in the direction D1. The pixel $K_{1 \times \beta}$, the pixel $K_{2 \times \beta}$, . . . and the pixel $K_{N1 \times \beta}$ (β is constant) have identical shapes such as squares or circles as seen in the direction D3 that is perpendicular to the direction D1 and the direction D2, and also have approximately equal pixel areas as seen in the direction D3. Of the light P2 entering the array type light-receiving device 22, a light component having a predetermined wavelength is incident on the pixel $K_{1 \times \beta}$, the pixel $K_{2 \times \beta}$, . . . and the pixel $K_{N1 \times \beta}$ (β is constant).

On the other hand, the number of the plurality of pixels $K_{\alpha \times \beta}$ arranged in the direction D2 (the line of pixels having a constant α) is N2. Specifically, the pixels $K_{\alpha \times \beta}$ include a pixel $K_{\alpha \times 1}$, a pixel $K_{\alpha \times 2}$, . . . and a pixel $K_{\alpha \times N2}$ (α is constant) arranged sequentially in the direction D2. The pixels $K_{\alpha \times \beta}$ (α is constant) arranged in the direction D2 constitute a plurality of pixel lines extending in the direction D2. The pixel $K_{\alpha \times 1}$, the pixel $K_{\alpha \times 2}$, . . . and the pixel $K_{\alpha \times N2}$ (α is constant) have identical shapes such as squares or circles as seen in the direction D3. The pixel $K_{\alpha \times 1}$, the pixel $K_{\alpha \times 2}$, . . . and the pixel $K_{\alpha \times N2}$ (α is constant) have different pixel areas from each other. The respective pixel areas (areas as seen in the direction D3) of the pixel $K_{\alpha \times 1}$, the pixel $K_{\alpha \times 2}$, . . . and the pixel $K_{\alpha \times N2}$ ($\alpha$ is constant) are determined in accordance with the wavelengths of light incident on the respective pixels.

The method for determining the respective pixel areas of a pixel $K_{\alpha \times 1}$, a pixel $K_{\alpha \times 2}$, . . . and a pixel $K_{\alpha \times N2}$ ($\alpha$ is constant) will be described below. It is provided that the pixel $K_{\alpha \times 1}$, the pixel $K_{\alpha \times 2}$, . . . and the pixel $K_{\alpha \times N2}$ ($\alpha$ is constant) each have a responsivity $R_\beta$ ($\beta$ is an integer of 1 to N2) and a pixel area $A_\beta$ ($\beta$ is an integer of 1 to N2) as seen in the direction D3 in accordance with the wavelengths of light incident on the respective pixels. Specifically, the light P2 dispersed by the spectroscopic device 3 includes a plurality of light components having a wavelength $\lambda 1$, a wavelength $\lambda 2$, . . . and a wavelength $\lambda N2$. In the line of the pixel $K_{\alpha \times 1}$, the pixel $K_{\alpha \times 2}$, . . . and the pixel $K_{\alpha \times N2}$ ($\alpha$ is constant), a light component having a wavelength $\lambda \beta$ is incident on the pixel $K_{\alpha \times \beta}$ ($\alpha$ is constant and $\beta$ is an integer of 1 to N2). The magnitudes of the values of the wavelength $\lambda 1$, the wavelength $\lambda 2$, . . . and the wavelength $\lambda N2$ are $\lambda 1 < \lambda 2 < \ldots < \lambda N2$. Provided that the pixels $K_{\alpha \times \beta}$ ($\alpha$ is constant and $\beta$ is an integer of 1 to N2) show the lowest responsivity at a certain wavelength $\lambda i$ among the wavelength $\lambda 1$ the wavelength $\lambda 2$, . . . and the wavelength $\lambda N2$, this lowest responsivity $R_i$ of the responsivities $R_\beta$ is exhibited by a pixel in which $\beta$ is i, namely, a pixel $K_{\alpha \times i}$. In other words, the pixel $K_{\alpha \times i}$ is least responsive to the wavelength of light incident thereon among the pixels in the same pixel line, namely, the pixel $K_{\alpha \times 1}$, the pixel $K_{\alpha \times 2}$, . . . and the pixel $K_{\alpha \times N2}$ ($\alpha$ is constant). The pixel area $A_i$ of this pixel $K_{\alpha \times i}$ is made to be largest of the pixel areas $A_\beta$. In other words, the pixel $K_{\alpha = i}$ is given the largest pixel area $A_i$ of all the pixels included in the line of the pixel $K_{\alpha \times 1}$, the pixel $K_{\alpha \times 2}$, . . . and the pixel $K_{\alpha \times N2}$ ($\alpha$ is constant). The pixel area $A_i$ is multiplied by the responsivity $R_i$ to give a product E, and the pixel areas $A_\beta$ are determined using $A_\beta = E/R_\beta$. That is, specifically, the pixel areas $A_\beta$ of the pixels $K_{\alpha \times \beta}$ ($\beta$ is not i) in the line of the pixel $K_{\alpha \times 1}$ the pixel $K_{\alpha \times 2}$, . . . and the pixel $K_{\alpha \times N2}$ except the pixel $K_{\alpha \times i}$ ($\alpha$ is constant) are the quotients of the product E divided by the responsivities $R_\beta$ of the pixels $K_{\alpha \times \beta}$ ($\beta$ is not i). Here, the product E is defined as the product of the responsivity $R_i$ and the pixel area $A_i$ of the pixel $K_{\alpha \times i}$. The responsivities $R_\beta$ of the pixels $K_{\alpha \times \beta}$ ($\beta$ is not i) correspond to the wavelengths of light incident on the respective pixels $K_{\alpha \times \beta}$ ($\beta$ is not i).

As described above, the pixel areas $A_\beta$ of the pixels $K_{\alpha \times \beta}$ are determined such that the product of the responsivity $R_\beta$ multiplied by the pixel area $A_\beta$ is constant (the product E). Consequently, the pixels $K_{\alpha \times \beta}$ are allowed to output uniform charges (or photocurrents) even when each of the pixels $K_{\alpha \times \beta}$ receives one of light components of the light P2 having different wavelengths from each other. That is, an amount of light received by each of the pixels $K_{\alpha \times \beta}$ is adjusted by controlling the pixel area $A_\beta$ according to the responsivity $R_\beta$ of the pixels $K_{\alpha \times \beta}$. As a result, the difference in charges (or photocurrents) output from the pixels $K_{\alpha \times \beta}$ is reduced. Accordingly, the signals of the wavelength information having uniform and large S/N ratios are obtained for the pixels $K_{\alpha \times \beta}$ ($\alpha$ is constant and $\beta$ is an integer of 1 to N2) in the array type light-receiving device 22.

As mentioned above, FIG. 4 illustrates spectral sensitivity characteristics of pixels $K_{\alpha \times \beta}$ in an array type light-receiving device 22. The spectral sensitivity characteristics illustrated in FIG. 4 show a measurement result for the pixel $K_{\alpha \times \beta}$ having a light-receiving layer made of InGaAs. In FIG. 4, the horizontal axis indicates the wavelength (unit: nm) of incident light, and the vertical axis indicates the responsivity (unit: A/W) at the wavelength. As illustrated in FIG. 5, the pixels periodically arranged in the direction D1 such as the pixels $K_{1 \times 1}$, to $K_{4 \times 1}$ have pitches L1, and the pixels periodically arranged in the direction D2 such as the pixels $K_{1 \times 1}$ to $K_{1 \times 6}$ in have pitches L2. In the embodiment, the pitches L1 are the same as the pitches L2 and are about 30 μm.

Figure 8A:
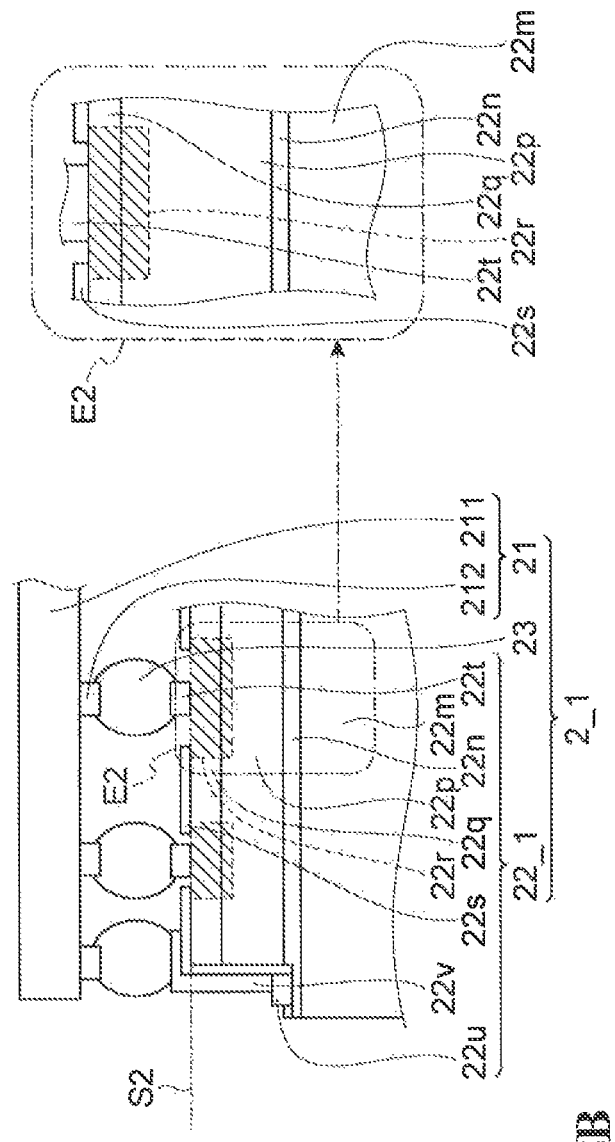
FIGS. 8A and 8B are views illustrating inside configurations of planar-type photodetectors having impurity diffusion regions corresponding to pixels.

The arrangement of pixels $K_{\alpha \times \beta}$ illustrated in FIG. 5 is applicable to array type light-receiving devices 22 illustrated in FIG. 6A (First Example) and FIG. 8A (Second Example). The array type light-receiving devices 22 illustrated in FIG. 6A and FIG. 8A have sensitivity for light having wavelengths in the range of 1000 to 1640 nm. The array type light-receiving devices 22 will be described assuming that N1 is 320 and N2 is 256. Light components having a wavelength 43 (13 is an integer of 1 to 256) are incident on the 256 pixels $K_{\alpha \times \beta}$ ($\alpha$ is constant) arranged in the direction D2, at wavelength intervals of 2.5 nm (=640 nm/256). For example, a light component of the light P2 which has $\lambda 1$ of 1000 nm is incident on the pixel $K_{\alpha \times 1}$; a light component of the light P2 which has $\lambda 2$ of 1002.5 nm is incident on the pixel $K_{\alpha \times 2}$; a light component of the light P2 which has $\lambda 3$ of 1005 nm is incident on the pixel $K_{\alpha \times 3}$; a light component of the light P2 which has $\lambda 4$ of 1007.5 nm is incident on the pixel $K_{\alpha \times 4}$; a light component of the light P2 which has $\lambda 5$ of 1010 nm is incident on the pixel $K_{\alpha \times 5}$; and a light component of the light P2 which has $\lambda 6$ of 1012.5 nm is incident on the pixel $K_{\alpha \times 6}$.

Referring to the spectral sensitivity characteristics illustrated in FIG. 4, the responsivity of the 256 pixels $K_{\alpha \times \beta}$ ($\alpha$ is constant) arranged in the direction D2 is lowest when $\beta$ is 1, namely, the pixel $K_{\alpha \times 1}$. The pixel $K_{\alpha \times 1}$ receives light having a wavelength $\lambda 1$ of 1000 nm. Referring to FIG. 4, it is shown that the responsivity in the wavelength range of 1000 to 1640 nm is lowest at 1000 nm. Given that the pixels are squares and L1=L2=30 μm, the pixel area $A_1$ of this pixel $K_{\alpha \times 1}$ is the largest area available, namely, 26 μm×26 μm. The responsivity $R_1$ of the pixel $K_{\alpha \times 1}$ is about 0.7 [A/W]. That is, in array type light-receiving devices 22 including InGaAs light-receiving layers as will be described with reference to FIG. 6A (First Example) and FIG. 8A (Second Example), the product E (the product of the responsivity $R_1$ multiplied by the pixel area $A_1$ of the pixel $K_{\alpha \times 1}$) is approximately 26×26×0.7. The pixel areas $A_\beta$ of the pixels $K_{\alpha \times \beta}$ ($\alpha$ is constant) are determined using this product E and the responsivities $R_\beta$ corresponding to the wavelengths of light incident on the respective pixels $K_{\alpha \times \beta}$.

First Example

Configurations of the photodetectors 2 will be described with reference to FIG. 6A and FIG. 6B. FIG. 6A schematically illustrates an inside configuration of the photodetector 2 as seen along a plane extending perpendicularly to the direction D1 and the direction D2. FIG. 6B illustrates Modified Example 1 of the configuration illustrated in FIG. 6A. The photodetector 2 includes a read-out circuit board 21, an array type light-receiving device 22 and bumps 23. The read-out circuit board 21 and the array type light-receiving device 22 are electrically connected to each other through the bumps 23. For example, the bumps 23 are composed of indium (In). The read-out circuit board 21 includes a substrate 211 and a plurality of electrodes 212. The electrodes 212 are connected to the bumps 23 and are connected to p-side electrodes 22f of the array type light-receiving device 22 through the bumps 23. The array type light-receiving device 22 includes a substrate 22a, a stacked semiconductor layer disposed on a principal surface of the substrate 22a, a passivation film 22e, the p-side electrode 22f, an n-side electrode 22g and a wiring electrode 22h. The stacked semiconductor layer includes a buffer layer 22b, a light-receiving layer 22c and a capping layer 22d. The array type light-receiving device 22 includes a plurality of mesas M.

The plurality of mesas M corresponds to the plurality of pixels $K_{\alpha \times \beta}$. The pixel areas of the plurality of pixels $K_{\alpha \times \beta}$ are defined by the mesas M. Specifically, the pixel areas of the plurality of pixels $K_{\alpha \times \beta}$ correspond to areas of the mesas M as seen in the direction D3 that is the direction perpendicular to the principal surface of the substrate 22a. The buffer layer 22b is disposed on the principal surface of the substrate 22a. The light-receiving layer 22c is disposed on the buffer layer 22b. The capping layer 22d is disposed on the light-receiving layer 22c. The mesas M are disposed on the substrate 22a. The mesa M includes the buffer layer 22b, the light-receiving layer 22c and the capping layer 22d. A region E1 shown in FIG. 6A includes the mesa M. The top surface and side surface of the mesa M are covered by the passivation film 22e. The passivation film 22e has an opening on the top surface of the capping layer 22d. The p-side electrode 22f is disposed in the opening of the passivation film 22e. The p-side electrode 22f is in contact with the capping layer 22d through the opening of the passivation film 22e. The wiring electrode 22h and the n-side electrode 22g are disposed at an outer periphery of the array type light-receiving device 22. The wiring electrode 22h is disposed on the passivation film 22e and is in contact with the n-side electrode 22g and the bump 23. The n-side electrode 22g is disposed on the substrate 22a in contact with the buffer layer 22b. The n-side electrode 22g is connected to the electrode 212 of the read-out circuit board 21 through the wiring electrode 22h and the bump 23.

The buffer layer 22b, the light-receiving layer 22c and the capping layer 22d are semiconductor layers sequentially disposed on the substrate 22a. For example, the substrate 22a is made of Fe-doped InP. The buffer layer 22b is made of n-type InGaAs doped with Si. The thickness of the buffer layer 22b is about 0.5 μm. The light-receiving layer 22c is made of non-doped InGaAs. The thickness of the light-receiving layer 22c is about 3 μm. The capping layer 22d is made of p-type InGaAs doped with Zn. The thickness of the capping layer 22d is about 1 μm. The p-side electrode 22f includes Ti/Pt/Au. The n-side electrode 22g includes Au/Ge/Ni. The passivation film 22e is made of a dielectric material such as $SiO_2$ or SiN.

A process for manufacturing the photodetectors 2 will be schematically described with reference to FIG. 7A. First, a substrate 22a_1 is provided. The substrate 22a_1 corresponds to the substrate 22a. The material of the substrate 22a_1 is the same as the material of the substrate 22a. On the substrate 22a_1, a semiconductor layer 22b_1, a semiconductor layer 22c_1 and a semiconductor layer 22d_1 are sequentially grown by an epitaxial growth method such as a metal-organic vapor phase epitaxy (MOVPE) method to form a stacked semiconductor layer. The semiconductor layer 22b_1 corresponds to the buffer layer 22b. The material of the semiconductor layer 22b_1 is the same as the material of the buffer layer 22b. The semiconductor layer 22c_1 corresponds to the light-receiving layer 22c. The material of the semiconductor layer 22c_1 is the same as the material of the light-receiving layer 22c. The semiconductor layer 22d_1 corresponds to the capping layer 22d. The material of the semiconductor layer 22d_is the same as the material of the capping layer 22d.

Next, the stacked semiconductor layer including the semiconductor layer 22b_1, the semiconductor layer 22c_1 and the semiconductor layer 22d_1 is etched by using a dry etching method. This etching results in the formation of mesas M corresponding to the pixels. A p-n junction is formed at an interface between the semiconductor layer 22c_1 (light-receiving layer 22c) and the semiconductor layer 22d_1 (capping layer 22d) in each of the mesas M. Further, a passivation film of $SiO_2$ (corresponding to the passivation film 22e) is formed on the surface of the mesas M. The passivation film covers the p-n junction exposed at a side surface of the mesa M to reduce a leak current. Next, openings are formed in the passivation film to reach the surface of the semiconductor layer 22d_1, and p-side electrodes 22f are formed in the openings of the passivation film. Further, n-side electrodes 22g are formed on the surface of the semiconductor layer 22b_1 at locations corresponding to outer peripheries of array type light-receiving devices 22. Through these steps, a wafer is formed which includes array type light-receiving devices 22 illustrated in FIG. 6A. Thereafter, the wafer is divided into a plurality of chips corresponding to the array type light-receiving devices 22 illustrated in FIG. 6A. On each of the chips, a plurality of bumps 23 is formed. This chip and a read-out circuit board 21 are bonded to each other through the plurality of bumps 23 by flip chip bonding. Through these steps, the photodetectors 2 of First Example are produced.

Another configuration of the mesas M illustrated in FIG. 6B will be described (Modified Example 1 of First Example). The mesas M may include a light-receiving layer 22i, a semiconductor layer 22j and a capping layer 22k in place of the light-receiving layer 22c and the capping layer 22d illustrated in FIG. 6A. The light-receiving layer 22i is disposed on the buffer layer 22b. The semiconductor layer 22j is disposed on the light-receiving layer 22i. The capping layer 22k is disposed on the semiconductor layer 22j. The light-receiving layer 22i, the semiconductor layer 22j and the capping layer 22k are semiconductor layers disposed sequentially on the substrate 22a. The light-receiving layer 22i has a type-II multi quantum well (MQW) structure. For example, the MQW structure is composed of non-doped InGaAs layers (thickness 5 nm) and non-doped GaAsSb layers (thickness 5 nm) that are staked alternately. The MQW structure includes 250 pairs of the InGaAs layers and the GaAsSb layers. The thickness of the light-receiving layer 22i is about 2.5 μm. The semiconductor layer 22j is made of non-doped InGaAs. The thickness of the semiconductor layer 22j is about 0.1 μm. The capping layer 22k is made of p-type InGaAs doped with Zn, for example. The thickness of the capping layer 22k is about 0.6 μm.

A process for manufacturing the photodetectors 2 of Modified Example 1 will be schematically described with reference to FIG. 7B. First, a substrate 22a_1 is provided. The substrate 22a_1 corresponds to the substrate 22a. The material of the substrate 22a_1 is the same as the material of the substrate 22a. On the substrate 22a_1, a semiconductor layer 22b_1, a semiconductor layer 22i_1, a semiconductor layer 22j_1 and a semiconductor layer 22k_1 are sequentially grown by an epitaxial growth method such as a MOVPE method to form a stacked semiconductor layer. The semiconductor layer 22i_1 corresponds to the light-receiving layer 22i. The material of the semiconductor layer 22i_1 is the same as the material of the light-receiving layer 22i. The semiconductor layer 22j_1 corresponds to the semiconductor layer 22j. The material of the semiconductor layer 22j_1 is the same as the material of the semiconductor layer 22j. The semiconductor layer 22k_1 corresponds to the capping layer 22k. The material of the semiconductor layer 22k_1 is the same as the material of the capping layer 22k.

Next, the stacked semiconductor layer including the semiconductor layer 22b_1, the semiconductor layer 22i_1, the semiconductor layer 22j_1 and the semiconductor layer 22k_1 is etched by using a dry etching method to form mesas M corresponding to the pixels. A p-n junction is formed at an interface between the semiconductor layer 22i_1 (light-receiving layer 22i) and the semiconductor layer 22j_1 (semiconductor layer 22j) in each of the mesas M. Further, a passivation film of $SiO_2$ (corresponding to the passivation film 22e) is formed on the surface of the mesas M. The passivation film covers the p-n junction exposed at a side surface of the mesa M to reduce a leak current. Next, openings are formed in the passivation film to reach the surface of the semiconductor layer 22k_1, and p-side electrodes 22f are formed in the openings of the passivation film. Further, n-side electrodes 22g are formed on the surface of the semiconductor layer 22b_1 at locations corresponding to outer peripheries of array type light-receiving devices 22 of Modified Example 1. Through these steps, a wafer is formed which includes array type light-receiving devices 22 of Modified Example 1. Thereafter, the wafer is divided into a plurality of chips corresponding to the array type light-receiving devices 22 of Modified Example 1. On each of the chips, a plurality of bumps 23 is formed. This chip and a read-out circuit board 21 are bonded to each other through the plurality of bumps 23 by flip chip bonding. Through these steps, the photodetectors 2 of Modified Example 1 are produced.

Second Example

Figure 8B:
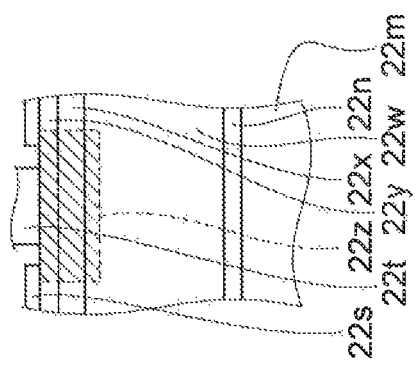

Configurations of photodetectors 2_1 will be described with reference to FIG. 8A and FIG. 8B. The configurations of the photodetectors 2_1 correspond to the configurations of the photodetectors 2 of First Example except that the array type light-receiving device 22 of First Example is replaced by an array type light-receiving device 22_1 of Second Example. The configurations of hyperspectral spectrometers 1_1 correspond to the configurations of the hyperspectral spectrometers 1 of First Example except that the photodetector 2 of First Example is replaced by the photodetector 2_1 of Second Example. Referring to FIGS. 1 to 3, the hyperspectral spectrometer 1 may be replaced by the hyperspectral spectrometer 1_1 of Second Example, the photodetector 2 may be replaced by the photodetector 2_1 of Second Example, and the array type light-receiving device 22 may be replaced by the array type light-receiving device 22_1 of Second Example.

FIG. 8A schematically illustrates an inside configuration of the photodetector 2_1 as seen along a plane extending perpendicularly to the direction D1 and the direction D2. FIG. 8B illustrates Modified Example 2 of the configuration illustrated in FIG. 8A. The photodetector 2_1 includes a read-out circuit board 21, an array type light-receiving device 22_1 and bumps 23. The read-out circuit board 21 and the array type light-receiving device 22_1 are electrically connected to each other through the bumps 23. For example, the bumps 23 are composed of indium (In). The read-out circuit board 21 includes a substrate 211 and a plurality of electrodes 212. The electrodes 212 of the read-out circuit board 21 are connected to the bumps 23. The electrodes 212 are also connected to p-side electrodes 22t of the array type light-receiving device 22_1 through the bumps 23. The array type light-receiving device 22_1 includes a substrate 22m, a stacked semiconductor layer disposed on a principal surface of the substrate 22m, a mask 22s, the p-side electrode 22t, an n-side electrode 22u and a wiring electrode 22v. The stacked semiconductor layer includes a buffer layer 22n, a light-receiving layer 22p, a capping layer 22q and an impurity diffusion region 22r. The array type light-receiving device 22_1 includes a plurality of impurity diffusion regions 22r.

The plurality of impurity diffusion regions 22r corresponds to the plurality of pixels $K_{\alpha\times\beta}$. The pixel areas of the plurality of pixels $K_{\alpha\times\beta}$, are defined by the impurity diffusion regions 22r. Specifically, the pixel areas of the plurality of pixels $K_{\alpha\times\beta}$ correspond to areas of the impurity diffusion regions 22r as seen in the direction D3 that is the direction perpendicular to the principal surface of the substrate 22m. The buffer layer 22n is disposed on the principal surface of the substrate 22m. The light-receiving layer 22p is disposed on the buffer layer 22n. The capping layer 22q is disposed on the light-receiving layer 22p. The impurity diffusion regions 22r are disposed on the surface (the surface S2) of the capping layer 22q. The impurity diffusion regions 22r extend from the surface of the capping layer 22q toward the light-receiving layer 22p. A region E2 shown in FIG. 8A includes the impurity diffusion region 22r. The top surface of the capping layer 22q is covered by the mask 22s. The mask 22s has an opening on the top surface of the capping layer 22q (the top surface of the impurity diffusion region 22r). The p-side electrode 22t is disposed in the opening of the mask 22s. The p-side electrode 22t is in contact with the capping layer 22q (the impurity diffusion region 22r) through the opening of the mask 22s. The wiring electrode 22v and the n-side electrode 22u are disposed at an outer periphery of the array type light-receiving device 22_1. The wiring electrode 22v is disposed on the mask 22s and is in contact with the n-side electrode 22u and the bump 23. The n-side electrode 22u is disposed on the substrate 22m in contact with the buffer layer 22n. The n-side electrode 22u is connected to the electrode 212 of the read-out circuit board 21 through the wiring electrode 22v and the bump 23.

The buffer layer 22n, the light-receiving layer 22p and the capping layer 22q are semiconductor layers sequentially disposed on the substrate 22m. For example, the substrate 22m is made of Si-doped InP. The buffer layer 22n is made of n-type InGaAs doped with Si. The thickness of the buffer layer 22n is about 0.5 m. The light-receiving layer 22p is made of non-doped InGaAs. The thickness of the light-receiving layer 22p is about 3 μm. The capping layer 22q is made of non-doped InP. The thickness of the capping layer 22q is about 1.5 μm. The p-side electrode 22t includes Au/Zn. The n-side electrode 22u includes Au/Ge/Ni. The mask 22s is made of a SiN film, for example.

Figure 9A:
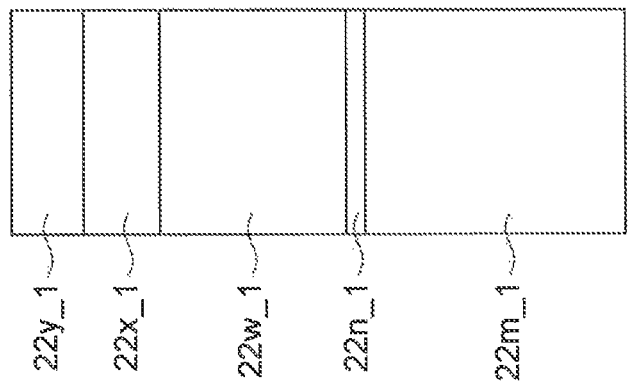
FIGS. 9A and 9B are views illustrating processes for manufacturing planar-type photodetectors having impurity diffusion regions corresponding to pixels.

A process for manufacturing the photodetectors 2_1 will be schematically described with reference to FIG. 9A. First, a substrate 22m_1 is provided. The substrate 22m_1 corresponds to the substrate 22m. The material of the substrate 22m_1 is the same as the material of the substrate 22m. On the substrate 22m_1, a semiconductor layer 22n_1, a semiconductor layer 22p_1 and a semiconductor layer 22q_1 are sequentially grown by an epitaxial growth method such as a MOVPE method to form a stacked semiconductor layer. The semiconductor layer 22n_1 corresponds to the buffer layer 22n. The material of the semiconductor layer 22n_1 is the same as the material of the buffer layer 22n. The semiconductor layer 22p_1 corresponds to the light-receiving layer 22p. The material of the semiconductor layer 22p_1 is the same as the material of the light-receiving layer 22p. The semiconductor layer 22q_1 corresponds to the capping layer 22q. The material of the semiconductor layer 22q_1 is the same as the material of the capping layer 22q.

Next, a mask composed of a SiN film (corresponding to the mask 22s) is provided on the surface of the semiconductor layer 22q_1. The mask has a pattern having openings through which p-type impurity such as zinc (Zn) is selectively diffused. Through the mask, zinc (Zn) is diffused from the surface of the semiconductor layer 22q_1 (capping layer 22q) toward the semiconductor layer 22p_1 (light-receiving layer 22p). This diffusion results in the formation of impurity diffusion regions 22r corresponding to the pixels. A p-n junction is formed at a diffusion front of Zn in the impurity diffusion regions 22r. For example, the p-n junction is formed at an interface between the semiconductor layer 22q_1 and the semiconductor layer 22p_1 in each of the pixels. The p-n junction may be formed at an upper portion of the semiconductor layer 22p_1. Next, p-side electrodes 22t are formed in the openings of the mask in contact with the top surface of the impurity diffusion regions 22r. In the embodiment, the mask on the surface of the semiconductor layer 22q_1 that is used for diffusing zinc (Zn) is not removed and becomes the mask 22s. Further, n-side electrodes 22u are formed on the surface of the semiconductor layer 22n_1 at locations corresponding to outer peripheries of array type light-receiving devices 22_1. Through these steps, a wafer is formed which includes array type light-receiving devices 22_1 illustrated in FIG. 8A. Thereafter, the wafer is divided into a plurality of chips corresponding to the array type light-receiving devices 22_1 illustrated in FIG. 8A. On each of the chips, a plurality of bumps 23 is formed. This chip and a read-out circuit board 21 are bonded to each other through the plurality of bumps 23 by flip chip bonding. Through these steps, the photodetectors 2_1 of Second Example are produced.

Next, another configuration illustrated in FIG. 8B will be described (Modified Example 2 of Second Example). The array type light-receiving device 221 may include a light-receiving layer 22w, a semiconductor layer 22x and a capping layer 22y in place of the light-receiving layer 22p and the capping layer 22q illustrated in FIG. 8A. The light-receiving layer 22w is disposed on the buffer layer 22n. The semiconductor layer 22x is disposed on the light-receiving layer 22w. The capping layer 22y is disposed on the semiconductor layer 22x. The buffer layer 22n, the light-receiving layer 22w, the semiconductor layer 22x and the capping layer 22y are semiconductor layers disposed sequentially on the substrate 22m. The light-receiving layer 22w has a type-II MQW structure. For example, the MQW structure is composed of non-doped InGaAs layers (thickness 5 nm) and non-doped GaAsSb layers (thickness 5 nm) that are stacked alternately. The MQW structure includes 250 pairs of the InGaAs layers and the GaAsSb layers. The thickness of the light-receiving layer 22w is about 2.5 μm. The semiconductor layer 22x is made of non-doped InGaAs. The thickness of the semiconductor layer 22x is about 1 μm. The capping layer 22y is made of non-doped or Si-doped InP to form a n-type InP layer. The thickness of the capping layer 22y is about 0.8 μm. An impurity diffusion region 22z is a Zn-diffused region and extends from the surface of the capping layer 22y to the light-receiving layer 22w.

Figure 9B:
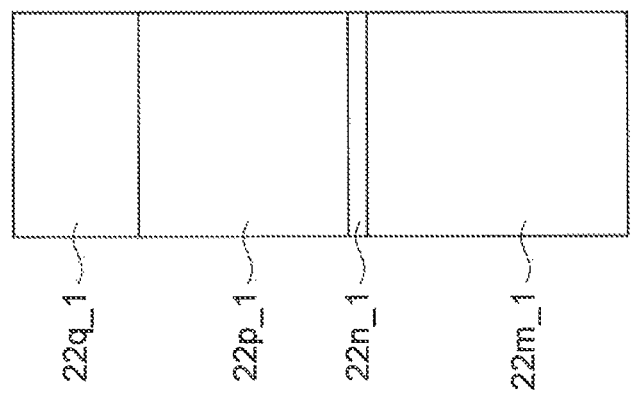

A process for manufacturing the photodetectors 2_1 of Modified Example 2 will be schematically described with reference to FIG. 9B. First, a substrate 22m_1 is provided. The substrate 22m_1 corresponds to the substrate 22m. The material of the substrate 22m_1 is the same as the material of the substrate 22m. On the substrate 22m_1, a semiconductor layer 22n_1, a semiconductor layer 22w_1, a semiconductor layer 22x_1 and a semiconductor layer 22y_1 are sequentially grown by an epitaxial growth method such as a MOVPE method to form a stacked semiconductor layer. The semiconductor layer 22w_1 corresponds to the light-receiving layer 22w. The material of the semiconductor layer 22w_1 is the same as the material of the light-receiving layer 22w. The semiconductor layer 22x_1 corresponds to the semiconductor layer 22x. The material of the semiconductor layer 22x_1 is the same as the material of the semiconductor layer 22x. The semiconductor layer 22y_1 corresponds to the capping layer 22y. The material of the semiconductor layer 22y_1 is the same as the material of the capping layer 22y.

Next, a mask composed of a SiN film is formed on the surface of the semiconductor layer 22y_1. The mask has a pattern having openings through which p-type impurity such as zinc (Zn) is selectively diffused. Through the mask, zinc (Zn) is selectively diffused from the surface of the semiconductor layer 22y_1 (capping layer 22y) toward the semiconductor layer 22w_1 (light-receiving layer 22w) through the semiconductor layer 22x_1 (semiconductor layer 22x). This selective diffusion results in the formation of impurity diffusion regions 22z corresponding to the pixels. A p-n junction is formed at a diffusion front of Zn in the impurity diffusion regions 22z. The concentration and diffusion depth of Zn impurity in the semiconductor layer 22w_1 (light-receiving layer 22w) is controlled by adjusting the thickness of the semiconductor layer 22x_1. For example, the p-n junction is formed in the semiconductor layer 22x_1 or at an interface between the semiconductor layer 22x_1 and the semiconductor layer 22w_1. The p-n junction may be formed at an upper portion of the semiconductor layer 22w_1. Next, p-side electrodes 22t are formed in the openings of the mask on the surface of the impurity diffusion regions 22z while remaining the mask on the surface of the semiconductor layer 22y_1. The p-side electrodes 22t are in contact with the top surface of the impurity diffusion regions 22z. Further, n-side electrodes 22u are formed on the surface of the semiconductor layer 22n_1 at locations corresponding to outer peripheries of array type light-receiving devices 22_1 of Modified Example 2. Through these steps, a wafer is formed which includes array type light-receiving devices 22_1 of Modified Example 2. Thereafter, the wafer is divided into a plurality of chips corresponding to the array type light-receiving devices 22_1 of Modified Example 2. On each of the chips, a plurality of bumps 23 is formed. This chip and a read-out circuit board 21 are bonded to each other through the plurality of bumps 23 by flip chip bonding. Through these steps, the photodetectors 2_1 of Modified Example 2 are produced.

While preferred embodiments have been discussed above while illustrating the principle of the present invention, those skilled in the art will appreciate that various modifications may be made to the configurations and the details discussed above without departing from the principle of the invention. The scope of the invention is not limited to any specific configurations disclosed in the embodiments. Therefore, the features defined in the appended claims and all modifications and alterations which are within the spirit of the invention are claimed.

What is claimed is:
1. An array type light-receiving device comprising:
a plurality of pixels two-dimensionally arranged in a first direction and a second direction perpendicular to the first direction, each of the pixels including a light-receiving layer providing a responsivity to a wavelength of light for each said pixel, wherein
the pixels arranged in the second direction constitute a plurality of pixel lines extending in the second direc- tion, the plurality of pixel lines being arranged in the first direction to form an array, the pixels in each of the pixel lines have pixel areas different from each other, in at least one of the pixel lines, the pixel area of each respective pixel is determined in accordance with said respective pixel's responsivity to a wavelength of light received thereby, and the pixels in each of the pixel lines include a first pixel and second pixel, the first pixel being configured to receive light at the wavelength at which the first pixel has said responsivity, and the second pixel having a pixel area determined by the first pixel's responsivity.

2. The array type light-receiving device according to claim 1, wherein the first pixel has a lowest responsivity and a largest pixel area of the pixels included in the pixel line, and wherein the pixel area of the second pixel is determined by the relational expression:

$$A_\beta = E/R_\beta$$

where $A_\beta$ represents the pixel area of the second pixel, E represents a product of the responsivity of the first pixel at the wavelength of light received by the first pixel multiplied by the pixel area of the first pixel, and $R_\beta$ represents the responsivity of the second pixel at the wavelength of light received by the second pixel.

3. The array type light-receiving device according to claim 1, wherein the plurality of pixels included in each of the pixel lines are arranged so as to receive corresponding light components having different wavelengths, the light components being separated along the second direction depending on the wavelengths.

4. The array type light-receiving device according to claim 1, wherein the pixels arranged in the first direction constitute a plurality of pixel rows extending in the first direction, and the pixel areas of the pixels in each of the pixel rows are approximately equal to each other.

5. The array type light-receiving device according to claim 1, further comprising:

a plurality of mesas corresponding to the pixels, each of the mesas including the light-receiving layer, a passivation film disposed on a top surface and a side surface of each mesa, the passivation film having an opening on the top surface of each mesa, and an electrode disposed in the opening in contact with the top surface of each mesa.

6. The array type light-receiving device according to claim 1, further comprising:

an impurity diffusion region corresponding to each pixel, each impurity diffusion region extending from a top surface of the corresponding pixel toward the light-receiving layer, a mask disposed on the top surface of the corresponding pixel, the mask having an opening on the impurity diffusion region, and an electrode disposed in the opening in contact with a top surface of the impurity diffusion region.

7. The array type light-receiving device according to claim 1, wherein the light-receiving layer includes an InGaAs layer.

8. The array type light-receiving device according to claim 1, wherein the light-receiving layer has a multi quantum well structure including InGaAs layers and GaAsSb layers stacked alternately.

9. A hyperspectral spectrometer comprising:

an array type light-receiving device; and a spectroscope configured to disperse incident light spectrally into a plurality of light components having different wavelengths, the spectroscope outputting dispersed light to the array type light-receiving device, wherein the array type light-receiving device includes a plurality of pixels two-dimensionally arranged in a first direction and a second direction perpendicular to the first direction, each of the pixels including a light-receiving layer providing a responsivity to a wavelength of light for each said pixel, the pixels arranged in the second direction constitute a plurality of pixel lines extending in the second direction, the plurality of pixel lines being arranged in the first direction to form an array, the light components of the dispersed light are separated along the second direction depending on wavelength, each of the pixels in at least one pixel line is configured to receive at least one of the light components, the pixels in each pixel line have different pixel areas, the pixel area of each respective pixel in the at least one pixel line being determined in accordance with said respective pixel's responsivity to the wavelength of the light component received thereby, and the pixels in each of the pixel lines include a first pixel and second pixel, the first pixel being configured to receive light at the wavelength at which the first pixel has said responsivity, and the second pixel having a pixel area determined by the first pixel's responsivity.

* * * * *